US007292063B2

United States Patent
Savage et al.

(10) Patent No.: US 7,292,063 B2
(45) Date of Patent: Nov. 6, 2007

(54) METHOD OF INTERCONNECT FOR MULTI-SLOT METAL-MASK PROGRAMMABLE RELOCATABLE FUNCTION PLACED IN AN I/O REGION

(75) Inventors: Scott C. Savage, Fort Collins, CO (US); Robert D. Waldron, Fort Collins, CO (US); Donald T. McGrath, Fort Collins, CO (US); Kenneth G. Richardson, Erie, CO (US)

(73) Assignee: LSI Corporation, Milpitas, CA (US)

( * ) Notice: Subject to any disclaimer, the term of this patent is extended or adjusted under 35 U.S.C. 154(b) by 169 days.

(21) Appl. No.: 11/120,067

(22) Filed: May 2, 2005

(65) Prior Publication Data

US 2006/0279326 A1    Dec. 14, 2006

(51) Int. Cl.
  G06F 7/38  (2006.01)
  H01L 25/00  (2006.01)
(52) U.S. Cl. .................. 326/38; 326/37; 326/41; 326/47; 326/101
(58) Field of Classification Search ................ 326/38, 326/37, 39, 40, 41, 47, 101; 716/19, 21
See application file for complete search history.

(56) References Cited

U.S. PATENT DOCUMENTS

| | | | | |
|---|---|---|---|---|
| 4,703,454 A * | 10/1987 | Jeuch | ............ | 365/154 |
| 6,064,225 A * | 5/2000 | Andrews et al. | ............ | 326/41 |
| 6,285,052 B1 * | 9/2001 | Draper | ............ | 257/300 |
| 6,351,020 B1 * | 2/2002 | Tarabbia et al. | ............ | 257/532 |
| 6,430,093 B1 * | 8/2002 | Eliason et al. | ............ | 365/189.11 |
| 6,509,758 B2 * | 1/2003 | Piasecki et al. | ............ | 326/37 |
| 6,747,478 B2 * | 6/2004 | Madurawe | ............ | 326/39 |
| 6,798,239 B2 * | 9/2004 | Douglass et al. | ............ | 326/29 |
| 2003/0057998 A1 * | 3/2003 | Lo | ............ | 326/38 |
| 2003/0161411 A1 * | 8/2003 | McCorkle et al. | ............ | 375/295 |
| 2004/0222817 A1 * | 11/2004 | Madurawe | ............ | 326/39 |
| 2005/0237083 A1 * | 10/2005 | Bakker et al. | ............ | 326/47 |
| 2006/0022705 A1 * | 2/2006 | Or-Bach et al. | ............ | 326/41 |
| 2006/0080631 A1 * | 4/2006 | Koo | ............ | 716/17 |

OTHER PUBLICATIONS

Author: Sung-Mo Kang, Title: CMOS Digital Integrated Circuits Analysis and Design, Pub. Date: Oct. 2002, Edition: 3rd Edition ISBN: 0-07-246053-9 Pertinent pp. 30-33.*

* cited by examiner

Primary Examiner—Rexford Barnie
Assistant Examiner—Thienvu Tran
(74) Attorney, Agent, or Firm—Christopher P Maiorana PC

(57) ABSTRACT

A method for interconnecting sub-functions of metal-mask programmable functions that includes the steps of (A) forming a base layer of a platform application specific integrated circuit (ASIC) comprising a plurality of pre-diffused regions disposed around a periphery of the platform ASIC, (B) forming two or more sub-functions of a function with a metal mask set placed over a number of the plurality of pre-diffused regions of the platform application specific integrated circuit and (C) configuring one or more connection points in each of the two or more sub-functions such that interconnections between the two or more sub-functions are tool routable in a single layer. Each of the pre-diffused regions is configured to be metal-programmable.

24 Claims, 5 Drawing Sheets

US 7,292,063 B2

METHOD OF INTERCONNECT FOR MULTI-SLOT METAL-MASK PROGRAMMABLE RELOCATABLE FUNCTION PLACED IN AN I/O REGION

FIELD OF THE INVENTION

The present invention relates to platform application specific integrated circuit (ASIC) design generally and, more particularly, to a method of interconnect for a multi-slot metal-mask programmable relocatable function placed in an I/O region.

BACKGROUND OF THE INVENTION

An-integrated circuit (IC) design can include support for mixed-signal functions. The term mixed-signal refers to functions involving both digital and analog signals. In platform ASICs, custom diffused mixed-signal areas are placed on metal mask programmable platforms to support a mixed-signal function. However, if the mixed-signal function is not used, the custom diffused area is wasted.

It would be desirable to have a method of interconnect for a multi-slot, metal-mask programmable, relocatable function placed in an I/O region.

SUMMARY OF THE INVENTION

The present invention concerns a method for interconnecting sub-functions of metal-mask programmable functions that includes the steps of (A) forming a base layer of a platform application specific integrated circuit (ASIC) comprising a plurality of pre-diffused regions disposed around a periphery of the platform ASIC, (B) forming two or more sub-functions of a function with a metal mask set placed over a number of the plurality of pre-diffused regions of the platform application specific integrated circuit and (C) configuring one or more connection points in each of the two or more sub-functions such that interconnections between the two or more sub-functions are tool routable in a single layer. Each of the pre-diffused regions is configured to be metal-programmable.

The objects, features and advantages of the present invention include providing a method of interconnect for a multi-slot metal-mask programmable relocatable function placed in an I/O region that may (i) provide a plurality of metal mask sets that when placed over a number of pre-diffused regions form two or more sub-functions of a relocatable function, (ii) provide one or more connection points in each of a set of metal masks that allow interconnections between the metal masks to be aligned, (iii) allow relocatable placement of multi-slot functions, (iv) reduce interconnect parasitics, (v) reduce hand editing and/or (vi) reduce review of a placement.

BRIEF DESCRIPTION OF THE DEAWINGS

These and other objects, features and advantages of the present invention will be apparent from the following detailed description and the appended claims and drawings in which:

DETAILED DESCRIPTION OF THE PREFERRED EMBODIMENTS

Figure 1:
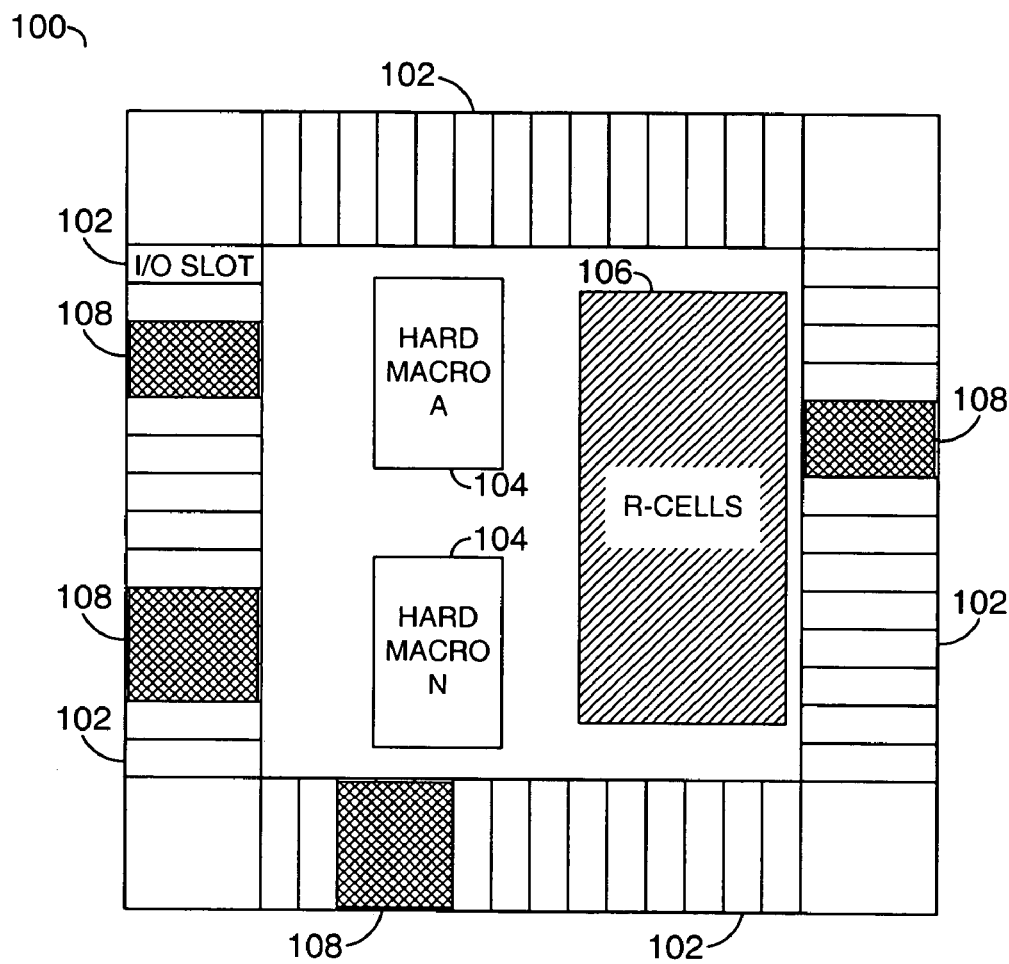
FIG. 1 is a block diagram illustrating a platform application specific integrated circuit (ASIC) in accordance with one or more preferred embodiments of the present invention.

Referring to FIG. 1, a block diagram of a programmable platform device (or die, or slice) 100 is shown in accordance with one or more preferred embodiments of the present invention. The slice 100 may be implemented, in one example, as a partially manufactured semiconductor device in which all of the silicon layers (or base layers) have been fabricated (e.g., a first processing or pre-inventory phase), but where customization of the slice 100 may be performed at a later time (e.g., a second processing or completed phase) via one or more metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice may be selected for customization at a later time because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

The slice 100 may comprise a number of pre-diffused regions. In one example, the slice 100 may comprise a plurality of regions 102, a number of regions 104, and one or more regions 106. The regions 102 may be implemented as configurable I/O slots (or ConfigIOs) located around a periphery of the slice 100. For example, each of the regions 102 may be configured to couple a core region of the slice 100 to an I/O pin. The regions 104 may be implemented as one or more hard IP blocks (or hardmacros). The regions 106 may be implemented as one or more diffused regions. In one example, the diffused regions 106 may comprise an R-cell transistor fabric. In another example, the diffused regions 106 may be implemented as gate array. The number of regions 102 may be distributed around a periphery (or edge) of the slice 100. The regions 104 and 106 may be distributed within a core region of the slice 100.

In one example, the regions 104 may be implemented similarly to an ASIC design. In general, the regions 104 may be configured to provide a number of functions on the slice 100. For example, the regions 104 may comprise phase locked loops (PLLs), instances of processors, input/output physical level (PHY) macros, and/or any other type of IP block appropriate to meeting the design criteria of a particular implementation. Soft and firm IP blocks may be implemented in the diffused region(s) 106.

The region 106 may be customized (e.g., by application of one or more metal layers), in one example, as logic and/or memory. For example, the region 106 may be implemented as a sea of gates array. In one example, the region 106 may be implemented as an R-cell transistor fabric comprising a number of R-cells. The term R-cell generally refers to an area of silicon designed (or diffused) to contain one or more transistors that have not yet been personalized (or configured) with metal layers. Wire layers may be added to the R-cells to make particular transistors, logic gates, soft and firm IP blocks and/or storage elements. For example, the programmable R-cells in the R-cell transistor fabric 106 may be customized to build non-diffused memories or other circuits for a particular application.

An R-cell generally comprises one or more diffusions for forming the parts of N and/or P type transistors and the contact points where wires may be attached in subsequent manufacturing steps (e.g., to power, ground, inputs and outputs). In general, the R-cells may be, in one example, building blocks for logic and/or storage elements. R-cells may be diffused in a regular pattern throughout a slice. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

Prior to customization, the regions 102 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors (e.g., N and P, TO, ATO, HP, etc.) may be implemented in each of the regions 102. Some example types and numbers of devices that may be implemented in the regions 102 may be summarized in the following TABLE 1:

TABLE 1

| CONFIGIO2 | | CONFIGIO1 | |
| --- | --- | --- | --- |
| Device Type | Number | Device Type | Number |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |
| nm_hp | 372 | | |
| nm_to | 1798 | | |
| resistors | 84 | | |

However, it will be understood by those skilled in the art that other types and/or numbers of devices may be implemented without departing from the spirit and scope of the present invention.

The devices implemented in the regions 102 may be programmed by defining metal mask sets. In one example, metal-metal capacitors (e.g., approximately one picofarad (pF) per slot) may be formed in the regions 102 where I/O power buses are absent. In one example, more than one of the regions 102 may be combined (e.g., coupled together via routing) to implement more complex functions. For example, metal mask sets may be placed over two or more of the generic pre-diffused regions 102 to form a relocatable multi-slot function 108. The term relocatable is used as a general term to indicate that the function may be located (or configured) in a number of locations around the slice 100. While the final result would be that the function 108 would be located in different locations, different pre-diffused regions 102 would be used to implement the function 108 in the different locations. Also, one or more of the functions 108 may be implemented throughout the plurality of regions 102. The multi-slot function 108 may be configured to provide mixed-signal functions using metal programmability.

In general, the present invention allows mixed-signal functions to be constructed without any special diffused circuitry, special process options, and/or additional wafer cost. Mixed-signal functions implemented with the multi-slot functions 108 may be relocated to any I/O slot 102 boundary. Because the multi-slot relocatable functions 108 can be located on any I/O slot 102 boundary, the present invention may provide a flexible pinout. Some examples of mixed-signal functions that may be implemented as multi-slot relocatable functions 108 may be summarized in the following TABLE 2:

TABLE 2

| Circuit | # of Slots | Applications | Function |
| --- | --- | --- | --- |
| PLL/DLL (500 MHZ range or less | 5-6 | Clock multipliers, clock-data deskew | Clock generation |
| Temperature Sensor (+/−10-15 degree C. accuracy) | 2-3 | Cabinet design, package selection verification, system testing, reliability verification | Provides digital output proportional to die temperature |
| Voltage regulator | 1-2 | Any product that employs dual voltages | Generates 1.2 V, 1.8 V, or 2.5 V supply from 2.5 V or 3.3 V supply. May use external pass device. |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20 Ksps Sigma-delta ADC | 1-3 | Circuit breakers, power meters, instrumentation, voice encoders, motor diagnostics, medical devices, process controllers | Sensor interface (temperature, touchpanel, battery monitor, vibration, humidity, position, other) |
| 8-bit, 10 Msps DAC | 2-3 | Motion control, process control, Tape/disc servos, digital trimming | Actuation and control |

TABLE 2-continued

| Circuit | # of Slots | Applications | Function |
|---|---|---|---|
| 32 Khz-50 Mhz Crystal Oscillator | 2 | Any application where a system clock is not always available: MP3 players, digital cameras, wireless devices, fish finders, featurized phones, circuit breakers | Generates a clock at a specified frequency set by the crystal |
| Filter (SC, CT) | 1-5 | Tape read-channels, voice encoders, instrumentation, circuit breakers | Conditions as analog signals |

However, other building blocks (or circuits) may be implemented accordingly to accomplish custom analog functions. For example, other building blocks may include, but are not limited to, operational amplifiers, comparators, analog multiplexers, analog switches, voltage/current reference. The region 106 may also be used to implement sub-functions of mixed-signal functions (e.g., switched capacitor filters, gm/C filters, data converters, etc.).

Figure 2A:
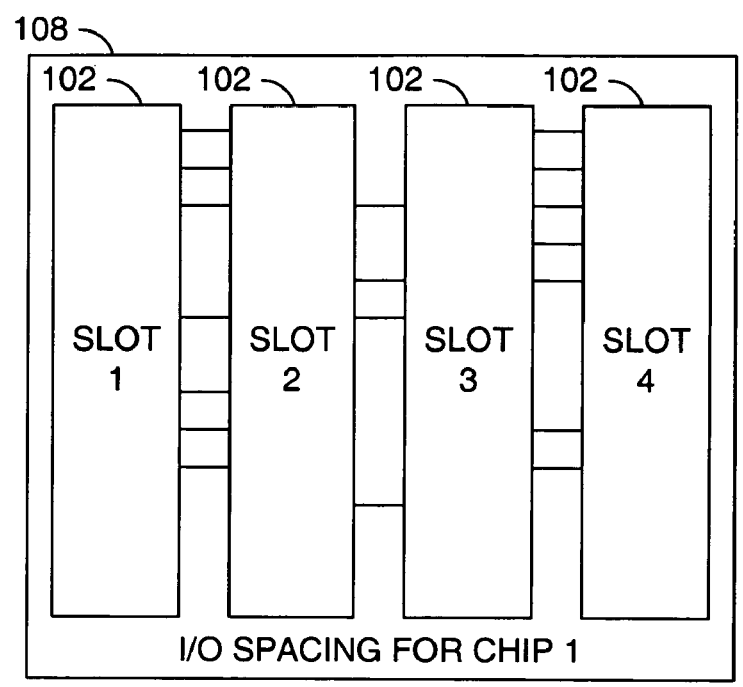
FIGS. 2(A-B) are block diagrams illustrating example interconnections for a multi-slot function in accordance with a preferred embodiment of the present invention.
Figure 2B:
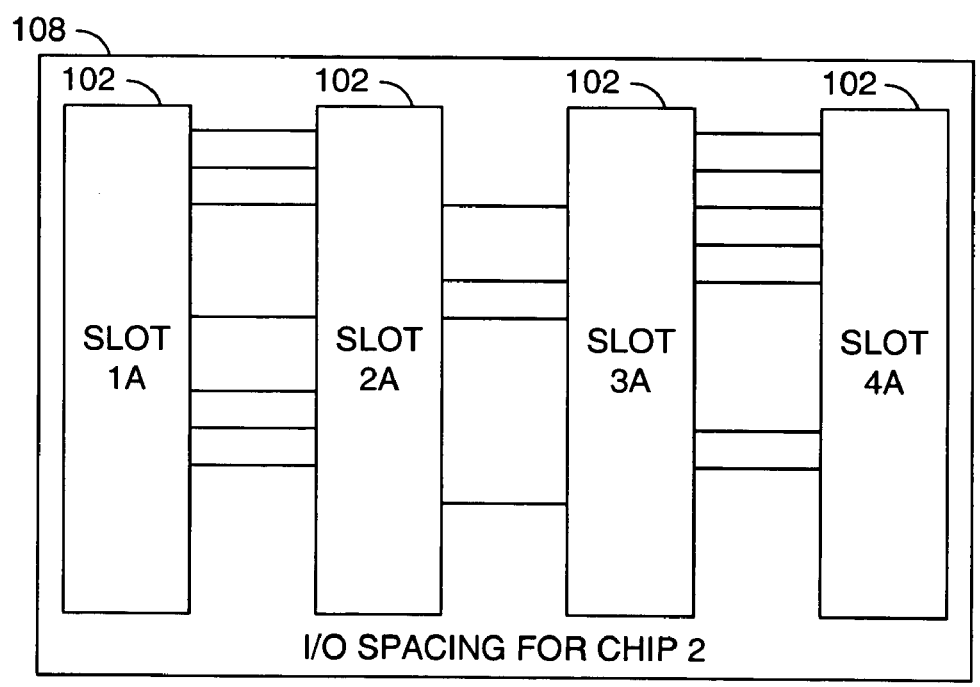

Referring to FIGS. 2(A-B), block diagrams are shown illustrating flexible spacing between sub-functions of a multi-slot relocatable function 108 implemented in accordance with the present invention. In one example, the multi-slot relocatable function 108 may be built using one or more metal mask sets. The metal mask sets may be placed over two or more of the generic pre-diffused regions 102. The metal mask sets may be configured to form two or more sub-functions of the relocatable function 108.

For any particular relocatable function 108, interconnects between the sub-functions may be implemented such that a place and route tool may automatically route the interconnects. In one example, the interconnects may be tool routable in a single layer of the slice 100. Although the interconnects may be routable in a single layer, it will be understood by those skilled in the art that the interconnects may be routed using more than one layer without departing from the spirit and scope of the invention. In general, the interconnects may be configured as non-crossing, minimum length connections between sub-functions having variable spacing. In a preferred embodiment, the interconnects may be implemented as straight, orthogonal interconnections between the sub-functions. Straight, orthogonal interconnections generally minimize parasitics. The multi-slot relocatable functions 108 in accordance with the present invention generally allow mixed-signal type or very sophisticated I/O functions to be defined and placed in the generic pre-diffused regions 102.

In general, the sub-functions implemented in each of the regions 102 may be configured such that connections between the sub-functions may be non-crossing and have minimum length. All of the circuitry of a sub-function may be contained within a respective region 102. The sub-functions may be configured such that the spacing between the sub-functions does not generally affect the interconnections or the operation of the relocatable function (e.g., the spacing between the sub-functions is not critical to performance). For example, the pad to pad pitch around the slice 100 does not need to be fixed to allow relocatable placement of a multi-slot relocatable function 108 implemented in accordance with a preferred embodiment of the present invention. For example, a relocatable function 108 may have a number of sub-functions that may be implemented with a first spacing (e.g., FIG. 2A) on a slice with a first pad pitch. The number of sub-functions of the relocatable function 108 implemented in accordance with the present invention may also be implemented with a second spacing (e.g., FIG. 2B) on a second slice having a second, wider pad pitch.

Figure 3:
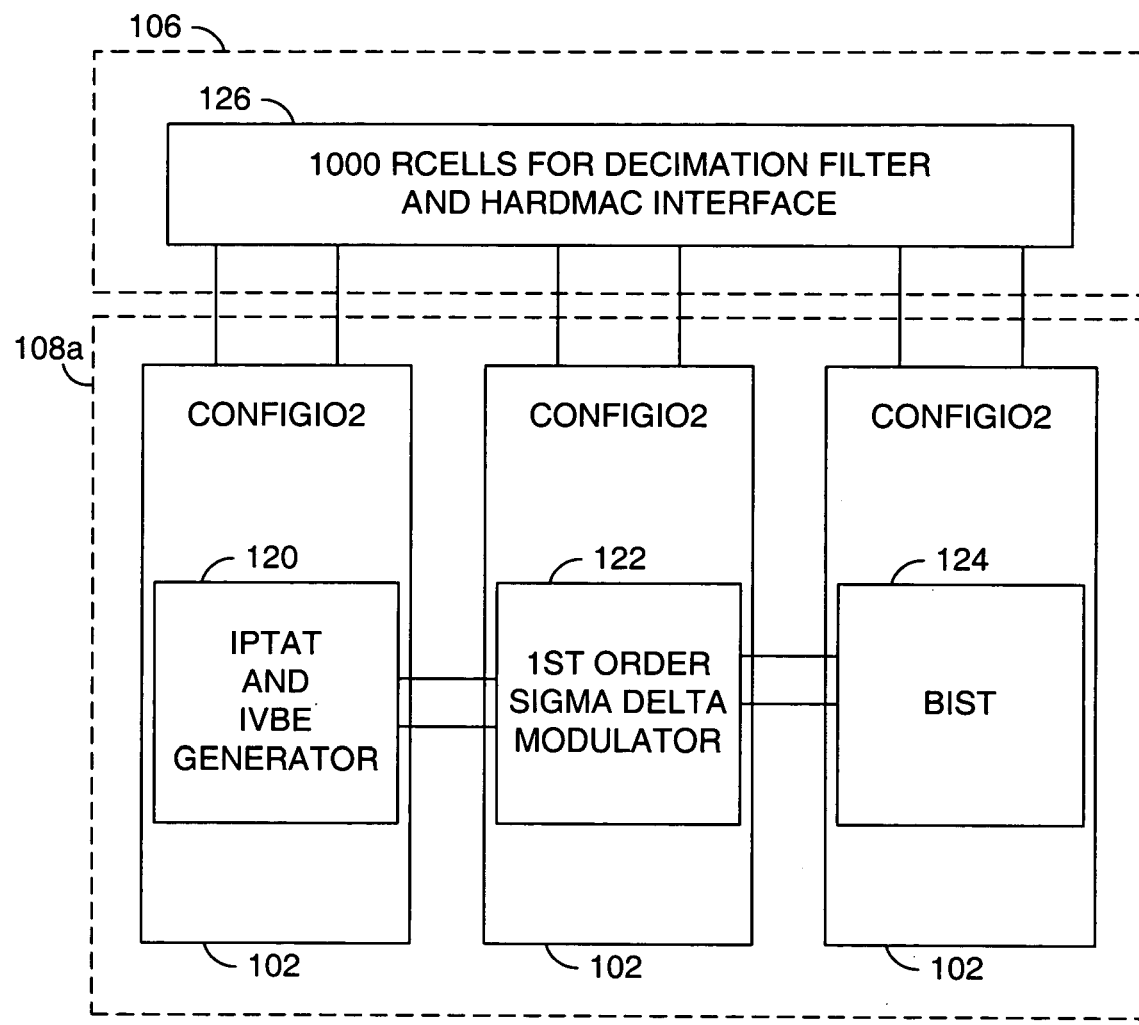
FIG. 3 is a block diagram illustrating a relocatable temperature sensing function in accordance with a preferred embodiment of the present invention.

Referring to FIG. 3, a block diagram is shown illustrating an example multi-slot relocatable function implemented in accordance with a preferred embodiment of the present invention. In one example, a multi-slot relocatable function 108a comprising a temperature sensor function may be implemented using three of the regions 102 and a portion of the region 106. For example, the multi-slot relocatable function 108a may comprise a sub-function 120, a sub-function 122, a sub-function 124 and sub-function 126. The sub-functions 120 to 126 of the multi-slot relocatable function 108a may be implemented with one or more metal mask sets configured to customize one or more respective regions 102 and/or a portion of the region 106.

In one example, the sub-function 120 may comprise a proportional to absolute temperature current (IPTAT) generator and a band-gap current (IVBE) generator. The sub-function 122 may comprise a first order sigma delta modulator. The sub-function 124 may comprise a built-in self test (BIST) circuit. The sub-function 126 may comprise a decimation filter and hardmac interface. The sub-function 126 may be implemented using a portion of the region 106 (e.g., using approximately 1,000 R-cells). In general, the layout of the sub-functions may be such that supply bus overlap is minimized. Minimizing supply bus overlap may reduce power supply coupling. The sub-functions 120, 122 and 124 may be configured such that interconnections between the sub-functions may be run (or routed) in a single layer. In one example, the interconnections may be routed straight and orthogonal (or perpendicular) with respect to the sub-functions. For example, the interconnections may be aligned with a single axis (e.g., a horizontal axis) of the slice 100.

Figure 4:
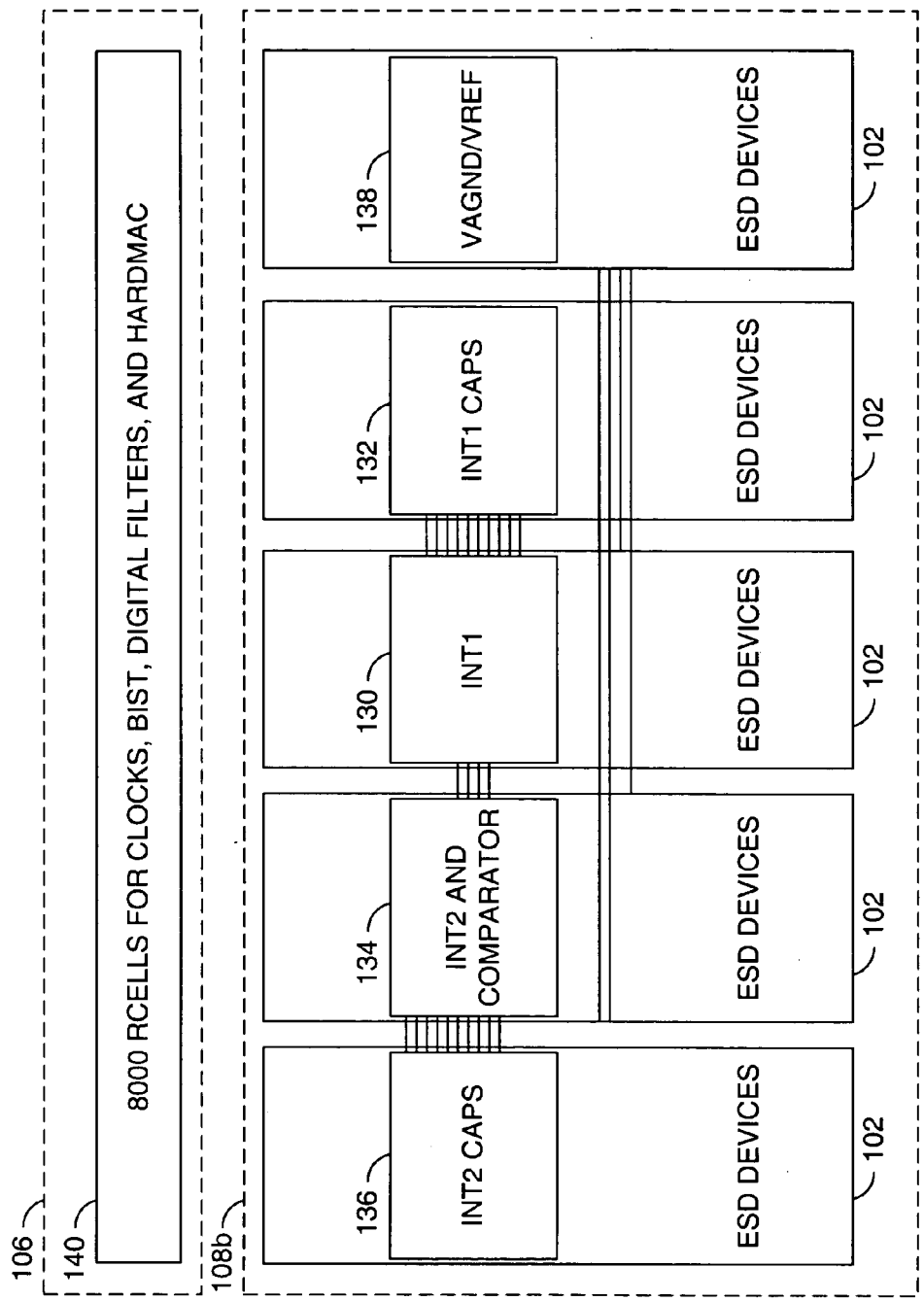
FIG. 4 is a block diagram illustrating a relocatable analog-to-digital convertor (ADC) function in accordance with a preferred embodiment of the present invention.

Referring to FIG. 4, a block diagram is shown illustrating another example multi-slot relocatable function implemented in accordance with another preferred embodiment of the present invention. In one example, a multi-slot relocatable function 108b may be configured to implement an analog-to-digital converter (ADC). The multi-slot relocatable function 108b may comprise a sub-function 130, a sub-function 132, a sub-function 134, a sub-function 136, a sub-function 138 and a sub-function 140. The sub-functions 130 to 140 of the multi-slot relocatable function 108b may be implemented with one or more metal mask sets configured to customize one or more respective regions 102 and/or a portion of the region 106.

In one example, the sub-function 130 may comprise a first integrator (e.g., INT1). The sub-function 132 may comprise one or more capacitors for the first integrator INT1 sub-function 130. The sub-function 134 may comprise a second integrator (e.g., INT2) and a comparator functions. The subfunction 136 may comprise one or more capacitors for the second integrator INT2 sub-function 134. The sub-function 138 may implement an analog supply ground (e.g., VAGND) and reference voltage (e.g., VREF). The sub-function 140 may comprise circuitry for clocks, built-in self test, digital filters and hardmac interfacing. In one example, the sub-function 140 may be implemented using R-cells (e.g., approximately 8000 R-cells) in a portion of the region 106.

In one example, the capacitors for the first integrator INT1 and the second integrator INT2 may be implemented in metal layers of a device implemented with the slice 100 (e.g., in second and third layers, third and fourth layers, second and fourth layers, etc.). In general, the capacitors are not placed under I/O or core power busses for noise isolation. In general, capacitors with a capacitance of less than four picofarad (pF) may be implemented in each of the integrators. The integrator capacitors and the analog ground and voltage reference generally act as pin isolation. In one example, bias voltages and currents may be routed in the second metal layer under I/O power busses with shielding provided by a third metal layer. Electrostatic discharge (ESD) devices may also be implemented in each of the regions 102. In general, the ESD devices may be placed under I/O power busses.

Figure 5:
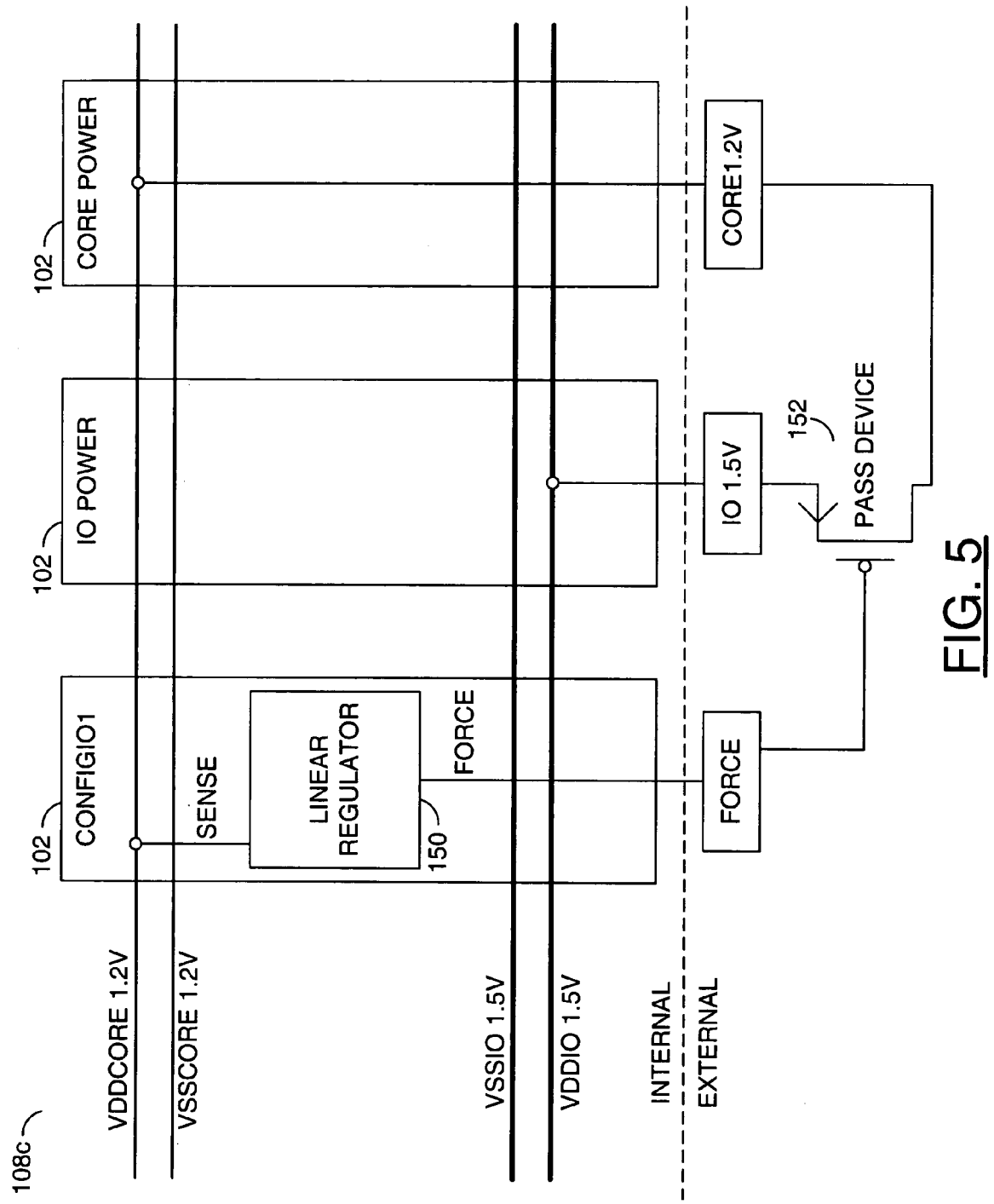
FIG. 5 is a block diagram illustrating a relocatable linear regulator function in accordance with a preferred embodiment of the present invention.

Referring to FIG. 5, a block diagram is shown illustrating another example multi-slot relocatable function implemented in accordance with another preferred embodiment of the present invention. In another example, a multi-slot relocatable function 108*c* may be configured to implement a voltage regulator function. The voltage regulator function may be configured to use an off-chip pass device. In one example, the voltage regulator using an off-chip pass device may be implemented using three of the regions 102. For example, the multi-slot relocatable function 108*c* may comprise a linear regulator 150 implemented in a first region 102. A second region 102 may be configured to present an external supply voltage (e.g., I/O) to an internal I/O supply voltage bus (e.g., VDDIO). A third region 102 may be configured to present an external supply voltage (e.g., CORE) to an internal core voltage supply bus (e.g., VDDCORE). In one example, the supply voltage IO may be 1.5V and the supply voltage CORE may be 1.2V.

An output from the first region 102 may be presented to a gate of an external pass device 152. In one example, the external pass device 152 may be implemented as one or more metal oxide semiconductor field effect transistors (MOSFETs). However, other types and polarities of transistors may be implemented accordingly to meet the design criteria of a particular implementation. A source of the external pass device 152 may be connected to receive the supply voltage IO. A drain of the external pass device 152 may be connected to present the supply voltage CORE. The linear regulator 150 may have an input (e.g., SENSE) that may be coupled to the internal core supply voltage bus and an output that may present a signal (e.g., FORCE). The signal FORCE may be implemented as a control signal. The signal FORCE may be presented to the gate of the external pass device 152. The linear regulator 150 may be configured to sense and control a voltage level of the internal core supply voltage bus VDDCORE using the external pass device 152. In one example, the multi-slot function 108*c* may be configured to generate a core voltage of 1.2 volts using an IO voltage supply of 1.5 volts. However, other voltage levels may be implemented accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

The invention claimed is:

1. A method for interconnecting sub-functions of metal-mask programmable functions comprising the steps of:
   (A) forming a base layer of a platform application specific integrated circuit (ASIC) comprising a plurality of pre-diffused regions disposed around a periphery of said platform ASIC, wherein each of said pre-diffused regions is configured to be metal-programmable;
   (B) forming two or more sub-functions of a function with a metal mask set placed over a number of said plurality of pre-diffused regions of said platform application specific integrated circuit, wherein said metal mask set customizes the number of diffused regions as circuitry of said two or more sub-functions; and
   (C) configuring one or more connection points in each of said two or more sub-functions such that interconnections from the one or more connection points in one of said two or more sub-functions to the one or more connections points in one or more other ones of said two or more sub-functions are tool routable in a single layer.

2. The method according to claim 1, wherein said sub-functions are configured such that a spacing between said sub-functions is not critical to performance.

3. The method according to claim 1, wherein said interconnections comprise non-crossing interconnections.

4. The method according to claim 1, wherein said interconnections are routed straight and orthogonal with respect to the sub-functions connected by said interconnections.

5. The method according to claim 1, wherein said metal mask set configures said number of pre-diffused regions of said platform ASIC as a function selected from the group consisting of (i) an operational amplifier, (ii) a comparator, (iii) an analog multiplexer, (iv) an analog switch, (v) a voltage/current reference, (vi) a phase locked loop (PLL), (vii) a delay lock loop (DLL), (viii) a temperature sensor, (ix) a regulator, (x) an analog-to-digital converter (ADC), (xi) a digital-to-analog converter (DAC), (xii) an oscillator and (xiii) a filter.

6. The method according to claim 1, wherein each of said pre-diffused regions comprises a number of transistor types.

7. The method according to claim 1, wherein said metal mask set is configured to define one or more metal-metal capacitors.

8. The method according to claim 1, wherein said interconnections are automatically routable.

9. The method according to claim 1, further comprising the step of:
   forming, said base layer further comprising one or more pre-diffused regions selected from the group consisting of (i) an R-cell transistor fabric and (ii) a gate array.

10. The method according to claim 1, wherein each of said pre-diffused regions is metal-programmable as an I/O slot of said platform ASIC and said function comprises a mixed-signal function.

11. An apparatus comprising:
   means for forming a base layer of a platform application specific integrated circuit (ASIC) comprising a plurality of pre-diffused regions disposed around a periphery of said platform ASIC, wherein each of said pre-diffused regions is configured to be metal-programmable;
   means for forming two or more sub-functions of a function from a number of said plurality of pre-diffused regions of said platform application specific integrated circuit, wherein said metal mask set customizes the number of diffused regions as circuitry of said two or more sub-functions; and
   means for configuring one or more connection points in each of said two or more sub-functions such that interconnections from the one or more connection points in one of said two or more sub-functions to the one or more donnection points in one or more other ones of said two or more sub-functions are tool routable in a single layer.

12. An apparatus comprising:
a base layer of a platform application specific integrated circuit (ASIC) comprising a plurality of pre-dif fused regions disposed around a periphery of said platform ASIC, wherein each of said pre-dif fused regions is configured to be metal-programmable;
a function comprising two or more sub-functions formed with a metal mask set placed over a number of said plurality of pre-diffused regions of said platform application specific integrated circuit, wherein said metal mask set customizes the number of diffused recrions as circuitry of said two or more sub-functions; and
one or more connection points in each of said two or more sub-functions configured such that interconnections from the one or more connection points in one of said two or more sub-functions to the one or more connection points in one or more other ones of said two or more sub-functions are tool routable in a single layer.

13. The apparatus according to claim 12, wherein said sub-functions are configured such that a spacing between said sub-functions is not critical to performance.

14. The apparatus according to claim 12, wherein said interconnections comprise non-crossing routing.

15. The apparatus according to claim 12, wherein said interconnections comprise straight, orthogonal routing with respect to said sub-functions.

16. The apparatus according to claim 12, wherein said function comprises a mixed-signal function selected from the group consisting of (i) an operational amplifier, (ii) a comparator, (iii) an analog multiplexer, (iv) an analog switch, (v) a voltage/current reference, (vi) a phase locked loop (PLL), (vii) a delay lock loop (DLL), (viii) a temperature sensor, (ix) a regulator, (x) an analog-to-digital converter (ADC), (xi) a digital-to-analog converter (DAC), (xii) an oscillator and (xiii) a filter.

17. The apparatus according to claim 12, wherein each of said pre-diffused regions comprises a number of transistor types.

18. The apparatus according to claim 12, wherein said interconnections are automatically routable.

19. The apparatus according to claim 12, wherein said base layer further comprises one or more pre-diffused regions selected from the group consisting of (i) an R-cell transistor fabric and (ii) a gate array.

20. The apparatus according to claim 12, wherein each of said pre-diffused regions is metal-programmable as an I/O slot of said platform ASIC and said function comprises a mixed-signal function.

21. The method according to claim 1, wherein said interconnections run parallel with a surface of said platform ASIC.

22. The method according to claim 1, wherein said interconnections run parallel with a horizontal axis of said platform ASIC.

23. The method according to claim 1, wherein a spacing between said two or more sub-functions is determined by a pad pitch of said platform ASIC.

24. The apparatus according to claim 12, further comprising:
one or more I/O slots formed using one or more of said pre-diffused regions not used by said function.

* * * * *